US009678138B2

(12) United States Patent
Forster et al.

(10) Patent No.: US 9,678,138 B2
(45) Date of Patent: Jun. 13, 2017

(54) UNIT AND METHOD FOR MONITORING AN INTEGRITY OF A SIGNAL PATH, SIGNAL PROCESSING SYSTEM AND SENSOR SYSTEM

(71) Applicant: Infineon Technologies AG, Neubiberg (DE)

(72) Inventors: Bernhard Forster, Finkenstein (AT); Kirk Herfurth, Munich (DE); Mihai Alexandru Ionescu, Villach (AT); Friedrich Rasbornig, Klagenfurt (AT); Christoph Schroers, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/926,207

(22) Filed: Oct. 29, 2015

(65) Prior Publication Data

US 2016/0131696 A1    May 12, 2016

(30) Foreign Application Priority Data

Nov. 12, 2014   (DE) .................. 10 2014 116 484

(51) Int. Cl.
*G01R 31/08* (2006.01)
*G01R 31/00* (2006.01)

(52) U.S. Cl.
CPC .......... *G01R 31/088* (2013.01); *G01R 31/007* (2013.01)

(58) Field of Classification Search
CPC .... G01R 31/00; G01R 31/005; G01R 31/006; G01R 31/007; G01R 31/02; G01R 31/021; G01R 31/024; G01R 31/08; G01R 31/088

USPC ....................... 327/1, 28, 510, 511
See application file for complete search history.

(56) References Cited

U.S. PATENT DOCUMENTS

| 3,665,394 A | 5/1972 | Lender et al. |
| 4,728,898 A * | 3/1988 | Staley, Jr. ........ G01R 19/16571 |
| | | 324/133 |
| 2006/0123289 A1* | 6/2006 | Williams ............. G01R 31/088 |
| | | 714/724 |

FOREIGN PATENT DOCUMENTS

GB    1482845 A    8/1977

OTHER PUBLICATIONS

German Patent Office, Office Action issued for DE 10 2014 116 484.9, dated Aug. 11, 2015.

(Continued)

*Primary Examiner* — William Hernandez
(74) *Attorney, Agent, or Firm* — Schiff Hardin LLP

(57) ABSTRACT

A monitoring unit (100; 800) for monitoring an integrity of a signal path (200; 620) configured to receive an input signal (210, 802) and further configured to provide an output (220) in response to the input signal (210, 802), comprises a signal monitor (110; 801) configured to extract a first signal (112; 630) from the signal path (200; 620) corresponding to the input signal (210, 802) in at least a first characteristic. The monitoring unit (100; 800) further comprises a signal interface (120; 803) configured to extract a second signal (122; 631) corresponding to the output (220) in at least a second characteristic from the signal path (200; 620); and an evaluator (130) configured to determine, whether the at least first characteristic of the first signal (112; 630) corresponds to the at least second characteristic of the second signal (122; 631) according to a predefined relation.

17 Claims, 11 Drawing Sheets

(56) References Cited

OTHER PUBLICATIONS

Infineon Technologies AG, "TLE4997: Programmable Linear Hall Sensor", Data Sheet, V 2.08, Sep. 2008, 34 pgs.
Infineon Technologies AG, "TLE4943C", Final Data Sheet for Robert Bosch, Rev. 1.1, May 2012, 48 pgs.
Infineon Technologies AG, "TLE5041plus C: Wheel Speed Sensor", Data Sheet, V 1.0, May 2013, 30 pgs.

* cited by examiner

UNIT AND METHOD FOR MONITORING AN INTEGRITY OF A SIGNAL PATH, SIGNAL PROCESSING SYSTEM AND SENSOR SYSTEM

FIELD

Embodiments relate to a monitoring unit and a method for monitoring an integrity of a signal path, to a signal processing system comprising a monitoring unit and a signal path and to a sensor system.

BACKGROUND

Monitoring of signal processing within signal paths is often desirable in order to conclude on an integrity of the signal path. Monitoring the integrity of a signal path may allow to conclude, whether an output of the signal path, which is determined by processing an input signal provided to the signal path, is reliable or not. This may be of interest, if a system relies on sensor data processed by a signal path in order to trigger safety measures. For example, in automobiles, a wheel speed sensor provides information on a rotational velocity of a wheel, which is used by an electronic control unit (ECU) in order to conclude on safe driving conditions of the vehicle. In a typical wheel speed sensor, the signal directly provided by a sensor element, such as for example a magneto-resistive sensing element, is processed within a signal path or a processing chain of analog or digital signal processing elements, before an output of the signal path is used to communicate information on the rotational speed to the electronic control unit. In the event of an error within the signal path, wrong information may be submitted and the safety of the passengers of the car may be at risk. Hence, there is a desire to monitor the integrity of the signal path in order to be aware of potential problems in case the integrity is not guaranteed and the output of the signal path should not be relied upon.

SUMMARY

Embodiments provide for the possibility to conclude on the integrity of a signal path configured to receive an input signal and to provide an output in response to the input signal. The monitoring unit comprises a signal monitor configured to extract a first signal from the signal path corresponding to the input signal in at least a first characteristic. The monitoring unit further comprises a signal interface configured to extract a second signal corresponding to the output signal in at least a second characteristic from the signal path. An evaluator of the monitoring unit is configured to determine whether the second characteristic corresponds to the at least a first characteristic according to a predefined relationship. Determining a correspondence between the second characteristic and the first characteristic may allow for deciding, whether the signal path is working reliably, at least between the two points along the signal path, where the first signal and the second signal are being extracted, respectively, the two points so being representative of a monitored portion of the signal path. A monitoring unit according to the embodiments described herein may indicate, whether the at least the monitored portion of the signal path work as expected and whether the output of the signal path can be relied upon or not.

According to further embodiments, a signal processing system comprises a signal path configured to receive an input signal and to provide an output in response to the input signal as well as a monitoring unit for monitoring an integrity of the signal path. The signal interface of the monitoring unit is coupled to the signal path further downstream than the signal monitor of the monitoring unit. A signal processing system according to the embodiments may determine whether an output provided by a signal path within the signal processing system is reliable.

According to further embodiments, a sensor system for determining information on a movement of an object comprises a signal processing system as well as an output interface configured to provide the information on the movement of the object determined using the signal processing system within the sensor. Information on the reliability of the sensor's output signal and, hence, on the reliability of the information on the movement of the object observed by means of the sensor may be provided by the sensor itself to allow subsequent processing devices to conclude, as to whether the sensor's output should be used.

BRIEF DESCRIPTION OF THE FIGURES

Some embodiments of apparatuses and/or methods will be described in the following by way of example only, and with reference to the accompanying figures, in which FIG. 1 schematically illustrates an embodiment of a monitoring unit.

DETAILED DESCRIPTION

Various example embodiments will now be described with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art.

Figure 1:
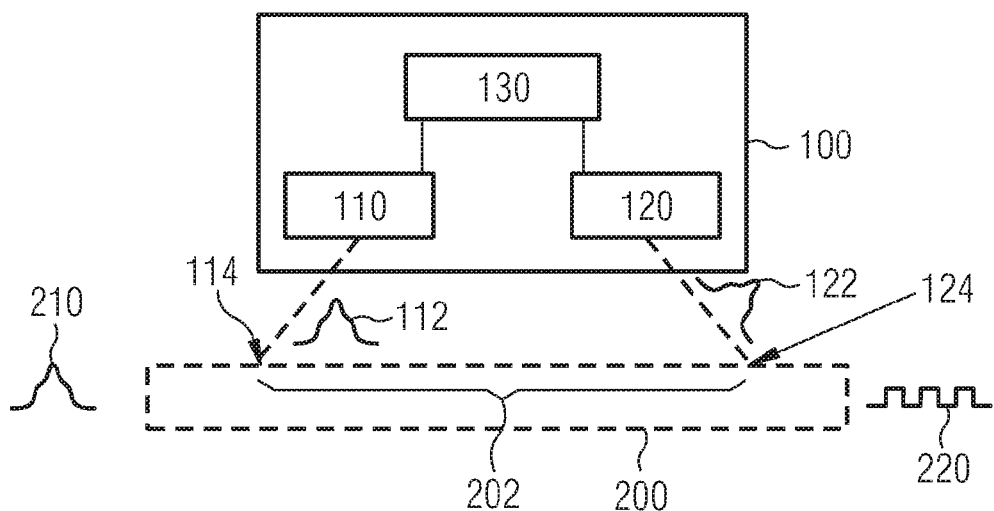

FIG. 1 schematically illustrates an embodiment of a monitoring unit 100 for monitoring an integrity of a signal path 200 configured to receive an input signal 210 and to provide an output 220 in response to the input signal. The monitoring unit 100 comprises a signal monitor 110 configured to extract a first signal 112 from the signal path corresponding to the input signal 210 in at least a first characteristic. The monitoring unit 100 further comprises a signal interface 120 configured to extract a second signal 122 corresponding to the output 220 in at least a second characteristic from the signal path and an evaluator 130 configured to determine whether the second signal is consistent with the at least first characteristic.

For illustrative purposes only, FIG. 1 also illustrates an example of a signal path 200 in dashed lines. The optional signal path 200 is only illustrated to facilitate the understanding of the functionality of the monitoring unit 100 for monitoring the integrity of the signal path 200. The signal path 200 receives an input signal 210 and provides an output 220 in response to the input signal 210. A signal path may comprise an arbitrary amount of individual signal processing components connected in an arbitrary manner to further process the input signal 210 and to provide an output 220 at the end of the signal path 200. Individual signal processing components may, for example, be amplifiers, comparators, filters, analog-to-digital or digital-to-analog converters or more complex digital circuitry. For example, the input signal may be amplified and digitized in order to provide a digitized representation of the input signal 210 as an output 220. The embodiments of monitoring units 100 are by no means restricted to one particular implementation of a signal path 200. Arbitrary signal paths can be monitored by embodiments of monitoring units 100. Also, the signal paths 200 may receive analog or digital input signals as well as provide analog or digital signals as an output. Likewise, the first signal 112 extracted or received from the signal path may be an analog or a digital signal and the second signal 122 extracted or received from the signal path 200 may be an analog or a digital signal, depending on the particular implementation.

For the teaching of the present disclosure it may be sufficient to consider an analog signal a signal that is not synchronized to a digital clock. It will be appreciated that in some circumstances it may be convenient to use a digital signal not synchronized to the digital clock, thereby reducing system complexity, considerably.

The signal path 200 will implement some sort of data processing on the input signal 210 and will thereby eventually generate the output signal 220 of the signal path 200. It is to be noted that the data processing may be expressed as a data flow or stream along the signal path 200. The data processing of the signal path 200 may be expressed in a functional manner and is typically known for a given application. Individual steps of the data processing may be implemented with functional units realizing an individual step of the data processing performed along the signal path. Without limitation some or all of these individual units may also be implemented as a piece of software or code performing the individual step of data processing.

For the purpose of this disclosure the monitoring unit 100 is adapted to monitor the data processing between a first point 114 at which the first signal 112 is extracted and a second point 124 at which the second signal 122 is extracted. The first point 114 may correspond to the beginning or input of the signal path. 200. The second point 124 may correspond to the end or output of the signal path 200. In such a configuration the monitoring unit 100 was to monitor the full signal path 200 since a monitored portion 202 between the first point 114 and the second point 124 corresponds to the full signal path 200.

However, depending on circumstances it may be of advantage to monitor the signal path 200 such that the first signal 112 is extracted downstream the input of the signal path 200, while the second signal 122 is extracted further downstream the point where the first signal 112 was extracted. Selecting the extracting points according to circumstances may allow for deliberately monitoring individual ones of the processing steps performed along the signal path 200.

A person of ordinary skill will understand that the present invention uses a first signal 112 corresponding to an input signal of the signal path in at least a first characteristic. This is to say that the first signal 112 may be a copy of the input signal 112 of the signal path 200. Depending on circumstances, it may however be sufficient to have a correspondence of the first signal 112 to the input signal 210 in one or more characteristics. It may be therefore of interest to choose the first one or more characteristics such that it represents information within the input signal 210 that is relevant for the signal processing that occurs along the signal path 200, more precisely between the points at a which the first signal 112 and the second signal 122 are extracted, respectively.

Likewise a person of ordinary skill will understand that the present disclosure uses a second signal 122 corresponding to an output 220 of the signal path 200 in at least a second characteristic. This is to say that the second signal 122 may be a copy of an output signal 220 of the signal path. Depending on circumstances, it may however be sufficient to have a correspondence of the second signal 122 to the output signal 220 in at least one characteristic. It may be therefore of interest to choose the one or more second characteristics such that it represents information within the output signal 220 that is relevant for the signal processing that occurs along the signal path 200, more precisely between the points at which the first signal 112 and the second signal 122 are extracted, respectively.

For the purpose of this description it may be sufficient to consider only the monitored portion 202 of the signal path 200, namely between the first point 114 where the first signal 112 is being extracted and the second point 124 at which the second signal 122 is being extracted. Any further signal processing before the first point 114 or after the second point 124 will not be monitored directly by the monitoring unit 100 according to this disclosure. If the first point 114 is considered the beginning of the monitored portion 202 of the signal path 200, the input signal to the monitored portion 202 of the signal path may be identical to the input signal of the monitored portion 202 of the signal path 200. Likewise if the second point 124 is considered the end of the monitored portion 202 of the signal path 200, the second signal 122 may be identical to the output of the monitored portion 200 of the signal path 200. A monitoring unit 100 according to the embodiments described herein may indicate, whether the monitored portion 202 of the signal path works as expected and whether the output 200 of the signal path 200 can be relied upon or not.

In other words, when the signal path 200 comprises numerous individual elements, the first signal 112 and the second signal 122 do not necessarily have to be extracted or received from the input of the signal path 200 and from the output of the signal path 200. Rather, the first signal 112 and the second signal 114 may be received from positions within the signal path 200 different from the input and the output of the signal path 200. The first signal 112 may correspond to the input signal 210 in at least one characteristic. It is of interest to choose the at least first characteristic to comprise information relevant to the data processing performed along the monitored portion 202 of the signal path 200. The second signal 122 may correspond to the output in at least a second characteristic. In other words, the second signal has a predetermined logical relation to the output of the signal path, although it may be received upstream the output. The second signal 122 may be received from a second position 124 further downstream the signal path 200 than the first signal 112. As the data processing along the monitored portion 202 of the signal path 200 is known, the at least one first characteristic typically has a predefined relationship with the at least one second characteristic.

The monitoring unit 100 allows, by means of the evaluator 130, to determine whether the at least second characteristic within the second signal 122 is in the predefined relationship with the at least first characteristic extracted by the first signal 112. The determination may be based on an a priori knowledge of a behavior of the components within the monitored portion 202 of the signal path 200 assuming they operate without error. It is therefore possible to decide, whether an integrity of the signal path 200, or at least the monitored portion 202 of the signal path, can be assumed, which may mean eventually, that the output 220 of the signal path 200 may be relied upon. If the at least first characteristic of the first signal 112 and the at least second characteristic of the second signal 122 reflect the predefined relationship given by the data processing steps performed along at least the monitored portion 202 of the signal path 200, one may assume correct operation along at least the monitored portion 202 of the signal path 200.

The following paragraphs shortly describe two simple scenarios of a signal path 200 and its associated monitoring unit 100 in order to further detail the dependency between the signal path 200 and the monitoring unit 100. The monitored signal path 200 operates on the input signal 210 and processes it to provide an output 220 in response to the input signal 210. For example, the output 220 may directly represent the input signal 210 in that the output 220 of the signal path 200 is expected to be a digital representation of the input signal 210. The output 220 would then be generated within the monitored signal path 200 by means of at least one analog-to-digital converter. The output 220 and the intermediate signals within the signal path 200 are interrelated to the input signal 210 in a predetermined manner given by the individual data processing steps performed along the (monitored) signal path. Suppose a first signal 112 is extracted at a first point along the monitored signal path. The first signal may correspond to the input signal by at least a first characteristic. The first characteristic may without limitation be a slope of a rising edge of the input signal 210 when crossing zero.

There may be some further data processing happening to the input signal 210 before the first signal 112 is being extracted at the first point 114. For the present disclosure it would be of interest that the first characteristic of the input signal 210 is maintained from the input of the signal path 200 to at least the first point 114, where the first signal 112 is being extracted. Given an a priori knowledge of the data processing performed along the signal path 200 and in particular the monitored portion 202 of the signal path 200, the first point 114 may be chosen accordingly. In the extreme case the first point 114 would be identical to the input of the signal path 200.

A second signal 122 may be received or extracted from a second point 124 within the signal path 200, typically downstream the first point 114. The second signal 122 may correspond in at least one characteristic to the output 220 of the signal path 200. For the given example this is to say that at least the slope of a rising edge when the output signal 220 crosses zero is represented within the second signal 122. As before there may be further data processing steps performed between the second point 124 and the end of the signal path 200. It may be of interest for the present disclosure to choose the second point 124 such that the second characteristic, i.e. the representation of the slope of a rising edge when crossing zero is present within the second signal 122. As the processing steps within the signal path 200 are known, the second point 124 may be chosen accordingly. According to one scenario the second point 124 would be identical with the output of the signal path 200.

In order to evaluate, whether the expected interrelation can be confirmed for the signal path 200 or at least the monitored portion 202 of the signal path 200, the evaluator 130 may assess if the slope of the rising edge when the signal crosses zero according to the first characteristic is represented in the second signal 122. For the analog-to-digital converter present in the signal path 200 described in this example, the slope of the rising edge zero crossing would need to be represented the second signal 122 which is a digital representation of the first signal 112, in order to confirm reliable operation of at least the monitored portion 202 of the signal path 200. More precisely the slope of the rising edge zero crossing according to the first characteristic would need to be present in the second characteristic extracted at the second point 124, namely in a digital representation of the slope at a rising edge zero crossing of the signal extracted, in order to confirm that the monitored portion 202 of the signal path 200 works reliably. In the example given reliable operation would mean that the analog-to-digital converter provides a reliable representation of rising edges at zero crossings of the first signal 112.

If the signal processing between the input of the signal path 200 and the first point 112 was not to affect the slope of rising edges at zero crossings, corresponding first and second characteristics would indicate that a slope of a rising edge of a zero crossing within the input signal 210 would be reliably represented within the second signal 122 and not adversely affected or degraded by malfunction of the analog-to-digital converter. If further the signal processing between the second point 124 and the output 220 of the signal path 200 was not to affect the slope of a zero crossing (for example due to a cut-off frequency of a filtering element), a correspondence of the first characteristic and the second characteristic established by the signal evaluator 130 would confirm that the whole signal path 200 was not to affect a slope of a rising edge within a zero crossing of the input signal 210 but provide a reliable representation of this characteristic within the output signal 220. This is to say that with regards to slopes of rising edge zero crossings the data processing along the signal path is reliable.

In another example, the purpose of the signal path 200 may be to derive the information that the amplitude of the input signal 210 passed a threshold. The first characteristic of the input signal 210 may hence be the passing of a threshold by the input signal 210. For example, the input signal 210 itself may then be extracted by the signal monitor 100 and the first point 114 may coincide with the input of the signal path 200. The evaluator 130 may, for example, derive whether the amplitude of the input signal 210 is within an interval comprising the threshold at a given time instant when the output 220 of the signal path 200 indicates the passing of the threshold. It may be convenient for the second signal 122 extracted from the signal path 200 to a second point 124 to be the output signal 220 itself or another signal corresponding to the output signal in at least a second characteristic. For example, while an output 220 of the signal path may be a digital quantity indicating the number of threshold crossings since the start of a measurement, the second signal 122 may be a digital signal generated upstream the output 220 and causing a counter within the signal path 200 to increase whenever a digital representation of the input signal 210 crosses zero. In this example, the second characteristic of the second signal 122 may correspond to a change of the output signal 220. If the evaluator determines that the amplitude of the input signal 210 is within the appropriately chosen interval according to the first characteristic and the second signal 122 simultaneously indicates the passing of the threshold by an increase of the counter as the second characteristic, it can be concluded that the signal path 200 operates correctly since the first characteristic of the first signal 112 is represented by the second characteristic of the second signal 122.

According to the embodiments described herein, the at least first characteristic of the input signal 210 monitored by means of the first signal 112 may be any suitable characteristic, depending on the particular implementation and the purpose of the signal path 200 as well as on the input signal 210 itself. For example, the first characteristic may be a zero crossing, a polarity of a signal, a direction of a signal change (slope or gradient), a phase, a frequency or other timing related parameters. The second signal 122 depends on the processing within the signal path 200, as outlined above, typically according to the predefined behavior of the signal path 200, as well as on the input signal 210 of the signal path 200. The second signal 122 may comprise a second characteristic in a representation given by the individual processing steps performed along at least the monitored portion 202 of the signal path 200. The second characteristic may be any representation of the first characteristics mentioned above, but is not limited thereto. In more general terms, the second signal 122 extracted may contain information, e.g. by exhibiting the second characteristic, which is interrelated to the at least first characteristic of the first signal 112 in a causal manner.

If firstly, as described before, the data processing steps between the input and the first point 114 substantially maintain the first characteristic, the reliability of the signal path 200 may be established between the input signal and the second point 124 using first and second characteristics. If secondly, the processing steps from the second point 124 to the output 220 of the signal path 200 substantially maintain the second characteristic, reliability may be established between the first point and the output of the signal path. If first and second condition were fulfilled alike, reliability may be established between the input signal 210 and the output 220, i.e. along the complete signal path 200.

In other words, the evaluator 130 may be configured to determine, whether the first characteristic of the input signal 210 is indeed represented within the output 220 by comparing a derived characteristic determined within the monitoring unit 100 using the first characteristic with the and a processing algorithm corresponding to the one of the signal path 200 or at least the monitored portion 202 of the signal path 200. Just as an example, when the evaluator 130 uses the first characteristic to perform comparable or identical operations as the signal path 200 and thus arrives at derived characteristic that corresponds to the second characteristic, it can be concluded that the signal path is working without error. Integrity can then be assumed, since the second characteristic substantially represents the first characteristic. In a simple non limiting example, the derived characteristic may be generated by processing of the first characteristic using essentially the processing algorithm of the signal path 200. To confirm correspondence, however, it is not necessarily required that the evaluator 130 performs identical operations. It is sufficient when the operations of the evaluator 130 are such that it can be concluded whether the first characteristic of the first signal 112 is substantially represented by the second characteristic of the second signal 122. For example, the evaluator 130 may perform identical operations, although with a reduced accuracy or resolution. In such an event, integrity may be assumed if the derived characteristic corresponds to the second characteristic or is even equal to the second characteristic within a predetermined tolerance range.

According to further examples, the monitoring unit 100 may be configured to provide a failure signal if the second characteristic does not corresponds according to a predefined relation to the first characteristic. For example, the failure signal may be used to communicate the information that the integrity of the signal path 200 cannot be guaranteed to further processing components or devices. According to further embodiments, monitoring unit 100 is further configured to identify inconsistent information within the second signal 122, in particular within the second characteristic. As opposed to conventional approaches using redundancy, examples of monitoring units 100 may be capable of positively confirming that the signal processing path 200 is working correctly without the need and expense of having a second, redundant signal path indicating whenever there is an inconsistency between a first device and a redundant second device. The approach according to the present disclosure will therefore considerably lower system complexity of a reliable signal path 100 as the redundant, second signal path may be omitted.

Further embodiments may also allow for identifying inconsistent information within the second characteristic and hence the second signal when compared to the first characteristic and therefore the first signal. In case of any such inconsistency the monitoring unit 100 may be configured to provide an information allowing to correct for the inconsistency, i.e. to correct an erroneous second signal, and consequently may even correct for an erroneous output of the signal path 200.

While some embodiments consist of the monitoring unit 100 alone, further embodiments may also comprise the signal path 200 configured to receive the input signal 210 and to provide the output 220 in response to the input signal 210. To this end, self-checking signal processing systems may be provided, without having a user of the signal path 100 to implement further consistency checks with regard to the output 220 of the signal path 200, since the signal path 200 is monitored within the signal processing system by the monitoring unit 100 being part thereof.

As an alternative the monitoring unit 100 may be integrated into existing signal paths 200, thereby forming a signal path 200 monitoring a correspondence of the second signal 122, namely the second characteristic to the first signal 112, namely the first characteristic using the monitoring unit 100 according to the present disclosure. By the integration of the monitoring unit 100 as some sort of upgrade or update, reliability of existing systems may be increased, as a person of ordinary skill in the art will readily appreciate.

According to some embodiments, the signal path 200 and monitoring unit 100 are monolithically integrated to provide for the enhanced functionality without a strong increase in further production or packaging costs.

Figure 2:
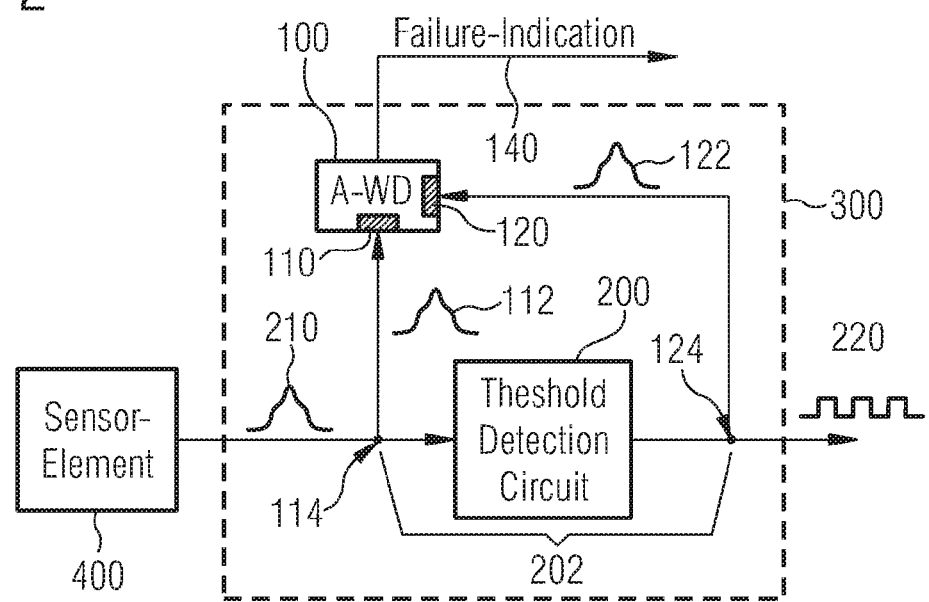
FIG. 2 illustrates a block diagram of signal processing system comprising an embodiment of a monitoring unit and a signal path.
Figure 4:
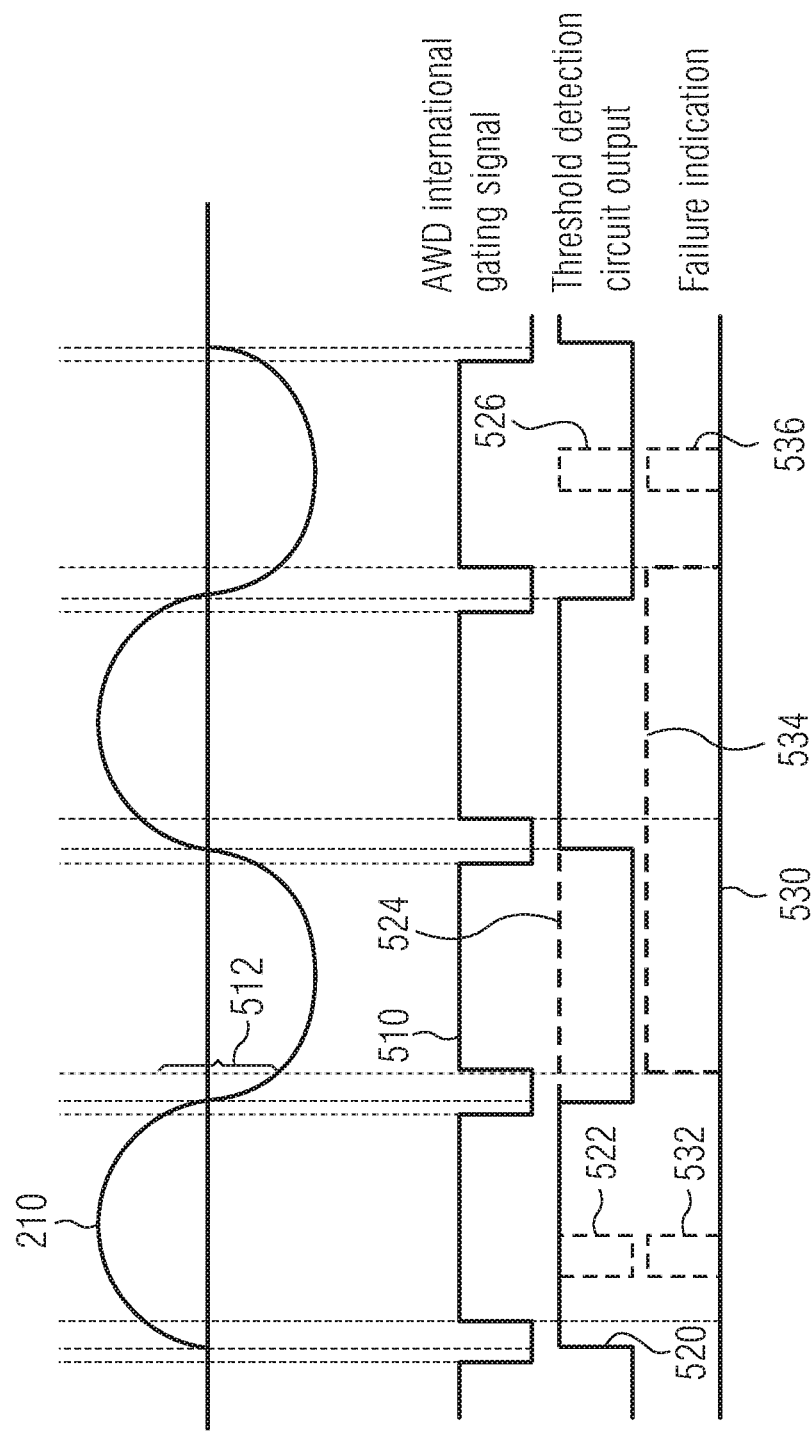
FIG. 4 illustrates different signals occurring within the signal path and the monitoring unit of the signal processing system illustrated in FIG. 3.

FIG. 2 illustrates an embodiment of a signal processing system 300 comprising a monitoring unit 100 and an example of a signal path 200 comprising only a threshold detection circuit. For the ease of understanding, the signal processing system 300 is illustrated together with an optional sensor element 400. The type of sensor element 400 to be combined with an embodiment of a signal processing system 300 is principally arbitrary. While particular sensor elements 400 and associated signal processing systems will be described with respect to FIGS. 5 to 9, the following discussion will mainly focus on the functionality of the signal processing system 300. The sensor element 400 provides an input signal 210 to the signal path 200. A practical example for a sensor element 400 would be a magneto-resistive or Hall sensor within a speed sensor operating together with an encoder generating a periodically alternating magnetic field. The sensor element 400 may be used in combination with an encoder wheel as a non-limiting example. An output of the sensor element 400 in the event of a periodically alternating magnetic field generated by an encoder moving relatively to the sensor element 400 would be substantially a sinusoidal signal having repetitive zero crossings at time instants corresponding to the speed of the relative movement. A relative movement may, for example, be caused by a rotation of an encoder wheel with respect to the sensor element 400. In other words, the frequency of the sinusoidal signal corresponds a velocity of the encoder and each zero crossing corresponds to a specific progression in movement, or a progression in angle of rotation in case of a rotating encoder wheel. For the further discussion of the functionality of the signal processing system 300 it shall be assumed that such a sensor element is used to provide the input signal 210. FIG. 4 illustrates a representation of such an input signal 210. A signal path 200 providing an output indicating the (rotational) speed may, therefore, essentially consist of a threshold detection circuit, determining each zero crossing of the input signal 210 provided by the sensor element 400. The threshold detection circuit may be configured to indicate whether the input signal 210 is above zero for two consecutive zero crossings or below zero, which is also assumed for the subsequent discussion. Thereby the threshold detection circuit may conveniently distinguish positive half waves from negative ones. Such functionality may be implemented using a comparator as known in the art.

In the example of FIG. 2, the first signal 112 received or extracted from the signal path 200 may be a copy of the analog signal provided by the sensor element 400 as an input signal 210 to the signal path 200 and the extracted second signal 122 may be a copy of an output signal 220 of the signal path 200. The output 200 may be a signal of square wave shape indicating each positive half wave of the sinusoidal signal as a positive square wave, while each negative half wave of the sinusoidal signal is represented by a zero line in the event that the signal path 200 essentially consist of a threshold detection circuit. FIG. 4 illustrates an example for such an output signal 520 in solid lines. The monitoring unit 100 (also denoted as a watch dog) may in this example receive input signal 210 as the first signal 112 and the output 220 as the second signal 122. The first signal 112 being above the threshold would be the first characteristic. The second characteristic of the second signal 122 would be likewise the signal being above zero. The monitoring unit 100 may be configured to provide a failure signal 140 when the evaluator 130 of the monitoring unit 100 determines that the second signal 122 does not correspond to the first signal 112. More precisely the warning or failure signal 140 may be issued in case the second characteristic of the second signal 122 is not representing the first characteristic of the first signal 112.

For this particular example, the first and second characteristic are both being "above a threshold of zero" in this example, while the first characteristic is in relation to the analog sinusoidal input signal 210 provided by the sensor element 400 while "above the threshold of zero" is as second characteristic of the square wave shaped second signal 122. If the first signal 112 was crossing zero with a rising edge to start a positive half wave, while the second signal 122 was zero, the first characteristic of the first signal 112 being above zero would not be represented in the second signal 122. More precisely the second characteristic is not present in the second signal 122, while the first characteristic is present within the first signal 112 and, consequently, the at least second characteristic does not correspond to the first characteristic according to the predefined relation. Should the first signal 112 be of rather low signal-to-noise ratio, a window comparator instead of a normal comparator may be used in order to implement the evaluation of the first characteristic. However, further embodiments may also use other components in order to evaluate the first characteristic. Instead of a window comparator, for example, two parallel comparators and an associated AND gate may be used. For the given example the second signal 122 may conveniently be an analog signal as is the first signal 112. Without limitation the second signal 122 may also be a digital signal, for example in case of a digital-to-analog converter (not shown) being present within the signal path 200. Depending on circumstances it is sometimes more convenient to use a simple comparator or window comparator that is not in sync with a digital time base instead of a square wave signal synchronized to a digital clock. The second option would considerably increase a footprint of a device, which may be unwanted for safety related applications.

Figure 3:
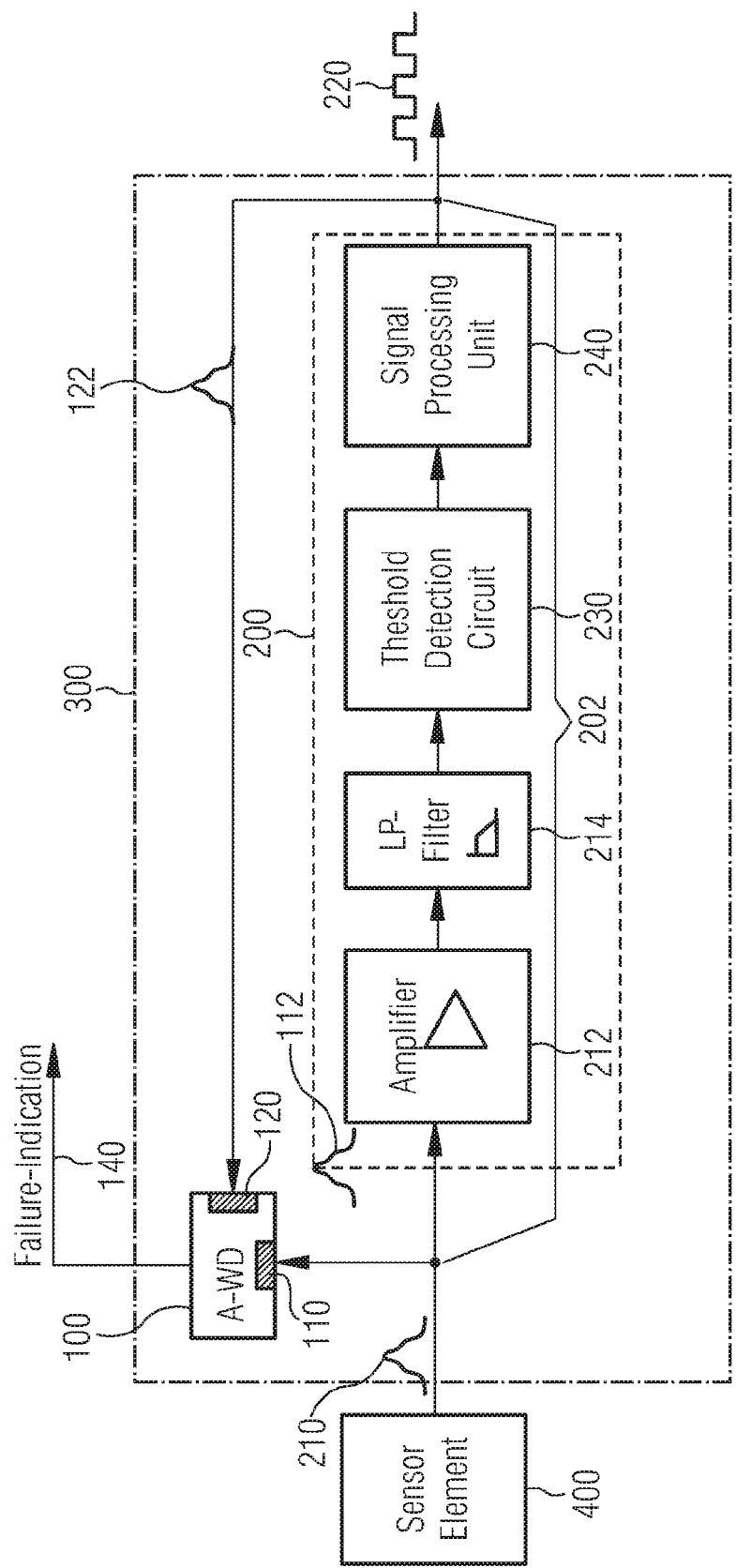
FIG. 3 illustrates an embodiment of a signal processing system comprising a signal path having the capability to determine a threshold crossing of an input signal.

FIG. 3 illustrates an example of a sensor system 600 having a signal path 200 essentially sensing a threshold crossing of the input signal 210 provided by the sensor element 400. The embodiment of FIG. 3 insofar corresponds to the embodiment of FIG. 2. The signal path 200 of the embodiment of FIG. 3 can be seen as a practical implementation of a threshold detection circuit of FIG. 2 comprising more elements. The following description of FIG. 3 will focus on the elements of the signal path 200 and the signals occurring therein. Further, associated signals occurring within an embodiment of a monitoring unit 100 are discussed with respect to FIG. 4. The signal path 200 comprises an amplifier 212, a low pass filter 214, a threshold detection circuit 230 and a digital circuit 240 subsequently connected to each other in the downstream direction of the signal path 200, i.e. in the direction of the signal processing. The input signal 210 is amplified before being low-pass filtered. The low-pass filtered signal is provided to the threshold detection circuit 230 in order to determine when the low-pass filtered signal crosses a threshold, e.g. the zero level. The determination of a threshold crossing is communicated to the signal processing unit or digital circuit 240. The digital circuit 240 may, for example, process threshold signal 520 to generate or provide the output 220 of the signal path 200. The output 220 communicates the information that a zero crossing has been determined to subsequent components in an arbitrary manner, e.g. using a particular data communication protocol.

Much like in the embodiment of FIG. 2, the first signal 112 provided to or extracted by the signal monitor 110 of the monitoring unit 100 is a copy of the input signal 210 to the signal path 200 and the second signal 122 is equivalent to the output 220 or a copy of an output signal provided by the signal path 200. Further embodiments may extract or receive the first and second signals from different positions along the signal path 200, however. The threshold detection circuit 230 signals a threshold crossing of the input signal 210 by means of threshold signal 520 having a square wave shape indicating each positive half wave of the sinusoidal input signal 210 as a positive square wave, while each negative half wave of the sinusoidal input signal 210 is represented by a zero line as already discussed with respect to FIG. 2 and as illustrated by means of threshold signal 520 in FIG. 4.

Like in the previous discussion of FIG. 2, it is assumed that the sensor element 400 provides a sinusoidal input signal 210, e.g since a previously discussed magneto-resistive sensing element of a speed sensor is used as a sensor element 400. The signals within the signal path 200 and the monitoring unit 100 are shown in FIG. 4 to illustrate, as to how correspondence of the second signal 122 to the first signal 112, more precisely correspondence of the first characteristic to the second characteristic is determined.

Figure 11:
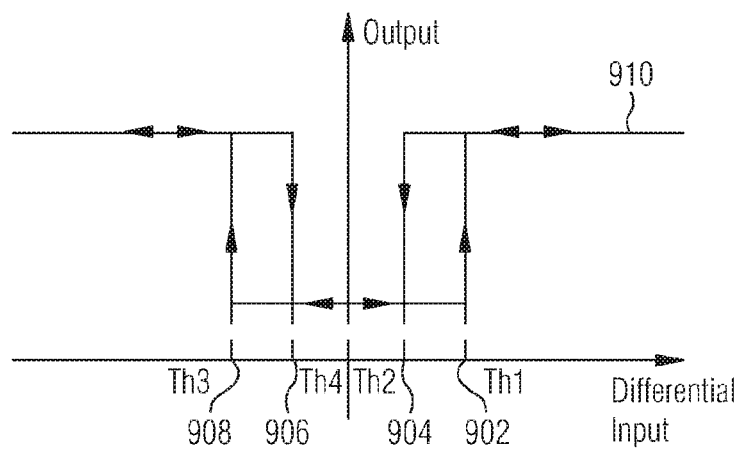
FIG. 11 schematically illustrates the functionality of a window comparator.

The sinusoidal input signal 210 is received from the sensing element 400. A window signal 510 illustrates the output of a window comparator within the monitoring unit 100. The window comparator may be used within the evaluator 130 of the monitoring unit 100 in order to evaluate the first characteristic of the first signal 112 to be able to conclude, whether the second characteristic of the second signal 122 extracted from the signal path 200 by the monitoring unit 100 is consistent with the at least first characteristic. In the particular example, the window comparator is used in order to provide a window signal 510 indicating the time intervals in which the amplitude of the first signal 112 (being a copy of the input signal 210) is within a predetermined interval 512 comprising zero. In the embodiment illustrated in FIG. 4, the predetermined interval 512 comprises zero Volts and is not symmetric with respect to zero Volts. The size or width of the interval 512 may remain constant while the start- and endpoints depend on whether the input signal 210 enters the interval 512 from below or above zero, i.e. from within a positive half wave or within a negative half wave of the input signal 210. In other words, the window comparator exhibits a hysteresis, as it may be known to a man of ordinary skill in the art. An example for an input-output characteristic of a window comparator is illustrated in FIG. 11. In further embodiments, other intervals, including those being symmetric with respect to zero, may be used as well as other comparators than window comparators.

The window signal 510 has a square wave shape indicating the presence of the amplitude of the input signal 210 within the predetermined interval 512 with a level of zero and (the window signal 510 being low), while a positive square wave of the window signal 510 indicates that the amplitude of the input signal 210 is outside the predetermined interval 512. The second signal 122 extracted by the monitoring unit 100 is, as discussed previously, a copy of the output 220 of the signal path 200, which is an output of the digital circuit 240. However, also a signal output by the threshold detection circuit 230 may be used instead, as well as other signals along the signal path 200, depending on which portion of the signal path 200 shall be monitored with the monitoring unit 100. Threshold signal 520 illustrated in solid lines in FIG. 4 shows the output 220 or an output of the threshold detection circuit 230 in a consistent mode of operation of the signal path 200. The threshold signal 520 corresponds to the general comparator signal as discussed with regards to FIG. 2. A positive half wave of threshold signal 520 corresponds to a positive half wave of the sinusoidal input signal 210, while negative half waves within the sinusoidal signal input signal 210 correspond to horizontal zero lines within the signal 520, respectively. In a consistent mode of operation, a failure indication signal 530 as illustrated in solid lines in FIG. 4 remains at zero level.

Signals 522, 524 and 526 in dashed lines illustrate possible outputs provided by the signal path 200 when errors occur within the signal path 200, i.e. when integrity of the signal path 200 is not given. The signals 522, 524 and 526 correspond to different inconsistent information within the output 220. Failure indication signal 530 illustrates the failure signal in a consistent mode of operation in solid lines. Signals 532, 534 and 536 illustrate the failure indication signal corresponding to the inconsistent operation modes illustrated by means of signals 522, 524 and 526, respectively. As illustrated in FIG. 4, when the second signal 520 indicates the presence of a zero crossing, whenever a zero crossing indeed occurs, a failure indication signal 530 is output staying at a zero level.

If, however, an erroneous detection of a zero crossing 522 is indicated by the output 220 or by means of the second signal 122 extracted from the signal path 200 in that the threshold signal 520 erroneously signals the presence of a negative half wave within the input signal 210, a failure indication signal 532 having a high level is provided, instead. Likewise, if the window comparator determines that a zero crossing should have occurred and, at the same time, the second signal 122 does not indicate a zero crossing as illustrated by means of signal 524 in that an associated change of the signal shape of the threshold signal 524 is not present, failure signal 534 is provided. Similar to the failure case corresponding to signals 522 and 532, if a threshold or zero crossing is indicated by signal 526 being representative for a positive half wave of the input signal 210 while the input signal 210 indeed remains within a negative half wave, failure signal 536 is provided. The signals 532, 534 and 536 may be generated within the monitoring unit 100 by interrelating the window signal 510 and the threshold signal 520 according to an appropriate logic to determine, whether the second characteristic corresponds according to the predefined relation to the first characteristic. To this end, the first characteristic of the first signal 112 would be the presence of the amplitude of the input signal 210 within the predetermined interval 512 defined by the window comparator. The second characteristic represented by the threshold signal 520 may be whether a positive half wave or a negative half wave is signaled by means of the threshold detection circuit 230 or whether the output 220 is above or below zero.

The evaluator 130 of the monitoring unit may determine whether the second characteristic corresponds to the first characteristic by, for example, interrelating logic states attributed to the positive voltage level and the zero voltage level of the threshold signal 520 and the window signal 510. For example, the zero voltage level may be identified with a "0" value of binary logic while the positive voltage level may be associated with a "1" of the binary logic or vice versa. As the man of ordinary skill in the art will appreciate, there may be numerous implementations to combine the window signal 510 and the threshold signal 520 to arrive at the failure indication signals having the different signal shapes 532, 534 and 536 in the event of an erroneous detection of threshold crossings or half waves as indicated by signals 522, 524 and 526. The combination may be performed using standard logic circuitry or gates, as for example AND gates, OR gates, Flip Flops or latches known in the art to arrive at the signal shapes 532, 534 and 536 illustrated in FIG. 4. One particular possibility is illustrated in FIG. 10 and will be described with respect to the embodiments of FIGS. 5 to 9 which comprise signal paths essentially identical to the signal path illustrated in FIG. 3.

According to some examples, monitoring unit 100 is also capable of identifying the inconsistent information within the second characteristic of the second signal and communicating the type of inconsistent information in order to correct the same. In the present embodiment, the length of the failure indication signal 532, 534, 536 may indicate whether the signal path 200 did erroneously fail to determine a zero crossing or whether the signal path 200 did erroneously determine the presence of a zero crossing within the positive half wave or the negative half wave of the input signal 210. Alternatively, two different signal processing chains may be implemented within a monitoring unit 100 to each provide an output being sensitive to one of the error cases above. A possible hardware implementation of an embodiment of a monitoring unit 100 having the capability to generate a failure signal having the signal shapes 530, 532, 534 and 536 corresponding to the different failure cases is given in FIG. 10 and will be described in the subsequent paragraphs. There may however be cases wherein from the first characteristic and the second characteristic the monitoring unit may 100 may only conclude that at least one of the elements within the monitored portion 202 of the signal path does not behave as expected, and therefore causes an output so that the first characteristic is no longer represented within the second characteristic according to signal and/or data processing steps performed along at least the monitored portion 202 of the signal path 200.

Alternatively or additionally the signal processing system 300 may comprise the sensor element 400 without limitation to form a sensor system. The sensor system may then not only provide information on a physical quantity sensed by the sensor element 400 but also information as to whether one should rely on the information provided by the sensor system, more precisely the sensor element 400 at an output interface of the sensor system.

In the subsequent embodiments of sensor systems in 5 to 9, speed sensor systems 600 are described as particular examples for embodiments of sensor systems. The sensor system 600, therefore, is assumed to comprise at least one sensor element 400 configured to sense an alternating magnetic field caused by movement of an encoder or an encoder configuration providing alternating magnetic poles when moved with respect to a sensor element 400 of the sensor system.

Of course, the sensor element 400 of further embodiments of sensor systems may be configured to generate a signal indicative of another physical property, such as, for example, a temperature, a pressure, a direction, a velocity, an acceleration, a chemical composition or the like. In other words, any sensing element 400 may be used together with signal processing systems 300 within a sensor system to provide reliable information on the sensed physical quantity.

FIGS. 5 to 9 illustrate embodiments of speed sensors 600 comprising a monitoring unit 100 to monitor a signal path 200 as elaborated on before. A particular example of a speed sensor 600 would be wheel speed sensor for determining a rotational speed of a wheel of an automobile.

Figure 5:
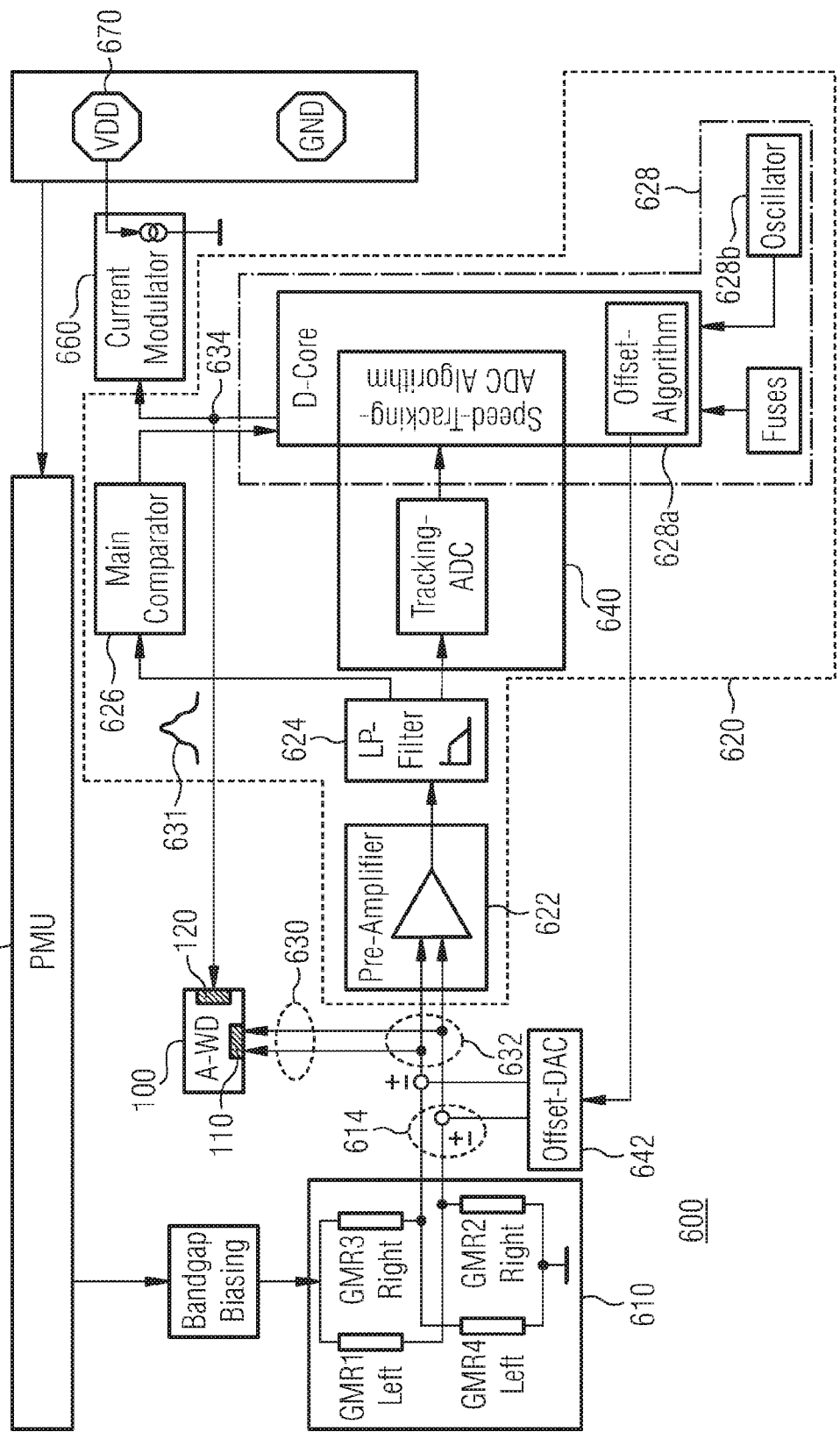
FIG. 5 illustrates an embodiment of a speed sensor system comprising an embodiment of a signal processing system based on the signal processing system of FIG. 3.

The wheel speed sensor 600 illustrated in FIG. 5 comprises a sensor element 610 composed of a bridge configuration of four giant magneto-resistive (GMR) cells as a non-limiting example. Power Supply to the individual components is provided by a power management unit 612. The giant magneto-resistive cells within the sensor element provide a differential input signal 614 to an input of a pre-amplifier 622 of the signal path 620. The amplified signal is low-pass filtered by means of a low-pass filter 624. The low-pass filtered signal is provided to a comparator 626 in order to determine a zero crossing of the amplitude of the input signal 614, more precisely of a difference of the signals of the signal pair constituting the differential input signal. To this end, the functionality of the signal path of the embodiments of FIGS. 5 to 9 corresponds to the one discussed previously with respect to FIGS. 2, 3 and 4.

On the occurrence of a threshold crossing, the comparator 626 provides a comparator signal to a digital circuit 628. The digital circuit 628 comprises a digital core 628a as well as an oscillator 628b. The oscillator 628b may provide an optional clock signal for the digital core 628a. In other words, the digital core 628a is clocked by means of the oscillator 628b. The digital circuit 628 may be distinguished from analog circuitry in that the analog circuitry is not operating according to a clock signal, for example provided by the oscillator 628b. While the output signal of the comparator 626 may have a signal shape similar to that of a digital signal, the comparator signal does not necessarily occur at edges of the clock signal provided or used to clock the operation of the digital core 628a. In other words, the comparator may be operated in the analog domain, this is to say not in sync with the clock and thereby reducing footprint of the overall system, which may be of interest for safety relevant systems.

In order to compensate for possible systematic offsets of the input signal 614, a tracking functionality 640 is provided using a tracking analog-to-digital converter 640a and associated logic within the digital core 628a. The tracking analog-to-digital converter 640a digitizes the signal after the low pass filter 624 to enable the digital core 628a of the digital circuit 628 to perform a continuous monitoring of the amplitude of the input signal 614. Once an offset is determined within the input signal 614, the digital core 628a controls a digital-to-analog converter 642 to compensate the offset by applying a bias voltage to the input signal 614.

In the embodiment illustrated in FIG. 5, the signal monitor 110 of the monitoring unit 100 extracts or receives a copy of the input signal 614 as the first signal 630 while the second signal 631 extracted or received from the signal path 600 by means of the signal interface 120 is an output of the digital circuit 628. To this end, the signal monitor 110 may extract or receive an analog signal while the signal interface may extract or receive a digital signal 120. In the embodiment of FIG. 5, the integrity of the full signal path 620 can be monitored by means of the monitoring unit 100, since a first point 632 where the first signal 630 is extracted from is at the beginning of the signal path 620 and since a second point 634 where the second signal 631 is extracted from is at the end of the signal path 620. The signal path 620 of the embodiment of FIGS. 5 to 9 essentially performs the same signal processing as the signal path 200 illustrated in FIG. 3. Therefore, reference is herewith made to the description of FIGS. 2 and 3 as to how first and second characteristics may be chosen or defined and extracted by first and second signals, respectively, to be able to determine, whether a second characteristic of the extracted second signal 631 corresponds according to a predefined relation to a first characteristic of the extracted first signal 630. One particular hardware implementation for a monitoring unit 100 to be used with any of the embodiments of FIGS. 5 to 9 will be subsequently described with respect to FIG. 10.

The output of the signal path 200 and of the speed sensor 600 is communicated to subsequent components by an output interface 660 of the sensor system 600. A possibility of submitting the presence of a zero crossing of the input signal 612 via the output interface 660 is, for example, using current modulation, using at least two distinct current levels. In current modulation, the output interface 660 modulates a current at an external supply voltage terminal 670. A first predetermined current level may be used to signal a first digital state while a second predetermined current level may be used to signal the second digital state. In the event of a zero crossing, one of the first or second current levels can be transmitted for a predetermined time, while the other one is transmitted the rest of the time. Alternatively, a change of the current levels may be used to signal the determination of a zero crossing. As a further alternative, the first current level may be used to signal a positive half wave of the input signal and the second current level may be used to signal a negative half wave, or vice versa.

According to some embodiments, the output interface is further used to provide the failure signal in that at least a third current level is used to communicate a missing integrity of the signal path 620. If subsequent components are made aware of the missing integrity of the output of the sensor system 600, they may enter a safe operation mode in which the sensor signal is disregarded. Further embodiments may also use an output interface using one or more distinct voltage levels to communicate the information on the movement of the object to subsequent components. Similar to an output interface using current modulation, a first voltage level may be used to signal a first digital state while a second voltage level may be used to signal the second digital state. A third voltage level may be used to communicate a missing integrity of the signal path.

In automotive applications, the failure signal communicated by a sensor system 600 (a speed sensor) may make an electronic control unit disregard the output of the sensor system 600 in its further processing, e.g. for further use within an anti-lock braking system. This may avoid safety critical driving conditions which may otherwise occur when an erroneous sensor signal is processed further. To this end, embodiments of monitoring units 100 may serve to make automotive sensors compliant with the ISO 26262 standard, which is a functional safety standard for automotive electric/electronic systems.

Before describing a particular hardware implementation of a monitoring unit 100 illustrated in FIG. 10, further embodiments of sensor systems 600 being essentially identical to the embodiment of FIG. 5 but distinguishing from FIG. 5 in that different portions of the signal path 620 are monitored, are shortly summarized in the subsequent paragraphs.

Figure 6:
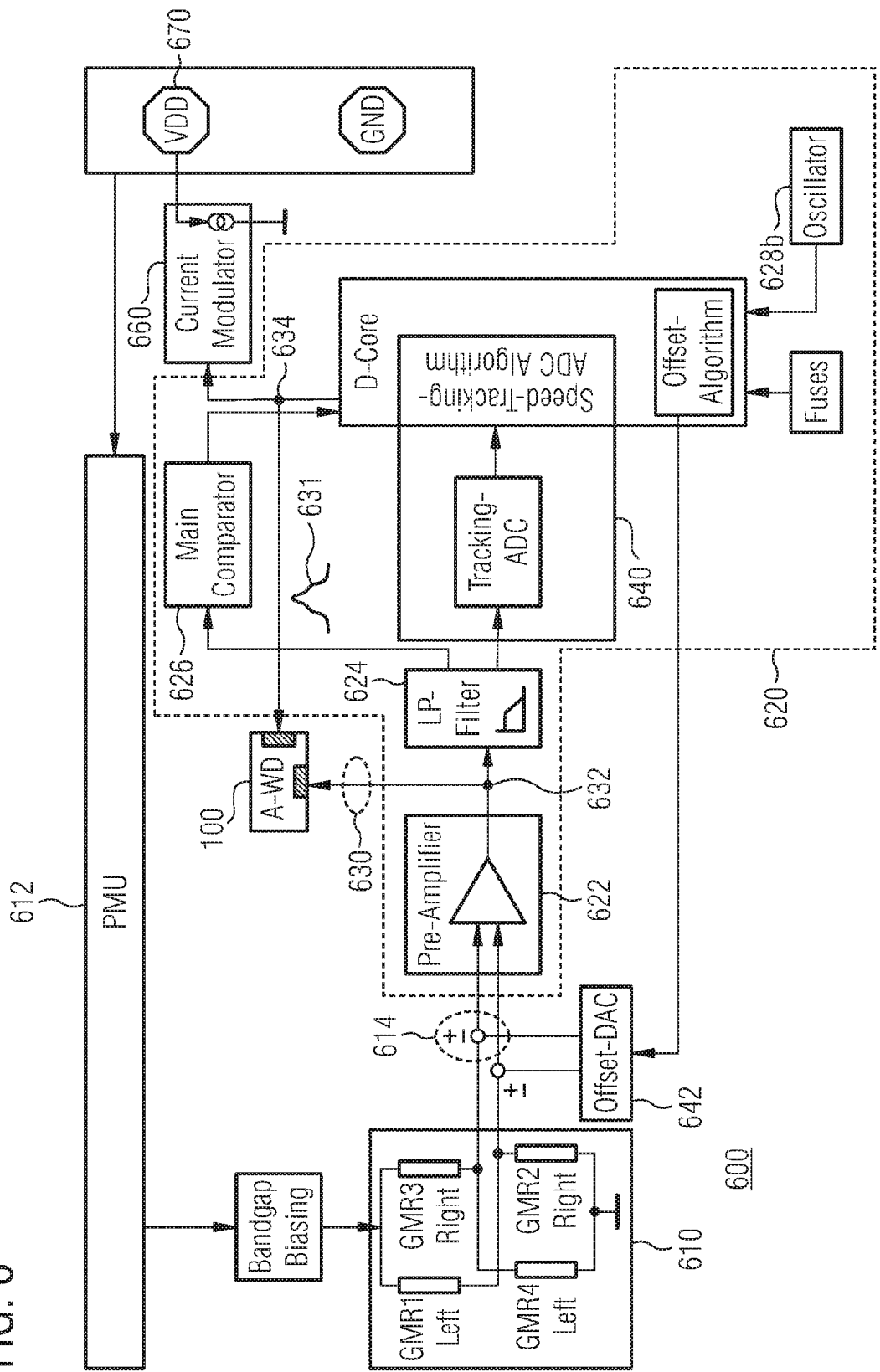
FIG. 6 illustrates a further embodiment of a speed sensor system based on the speed sensor of FIG. 5 while having a signal path with another monitored portion.

The embodiment of FIG. 6 corresponds to the embodiment of FIG. 5 and differs from the embodiment of FIG. 5 only in that the first signal for the monitoring unit 100 is received from a first position 632 further downstream the signal path 620. In particular, the first signal 630 is received after the amplifier 622. This still allows to conclude on the integrity of the signal path 620 while further reducing the complexity of the monitoring unit in that a single-ended signal is provided the monitoring unit 100. In particular, the digital core 628a and its functionality or integrity can still be monitored since they remain in the monitored portion of the signal path 620. The digital circuit 628 and, in particular, the digital core 628a, may consume significant amounts of semiconductor area and comprise a multitude of transistors and circuit elements. Hence, the risk for a failure or shortcut within the digital circuit may be higher than for analog components of the signal path 620 so that it may be desirable to monitor the digital components within the signal path 620, while it may be acceptable that one or more of the analog components within the signal path 620 are not monitored, which may enable further savings in area and cost. Further, if the first signal 630 is extracted after the amplifier 622 as in FIG. 6, a pre-amplifier within the monitoring unit 100 itself and the associated area may be saved. With respect to the ISO 26262 standard, the embodiment of FIG. 5 and further embodiments monitoring the digital circuit 620 may, therefore, still qualify as being compliant with Automotive Safety Integrity Level D when the risk of failure (Exposure Classification) is dominated by the digital circuit and, hence, the reduction of the monitored portion by means of exclusion of the amplifier 622 is acceptable.

Figure 7:
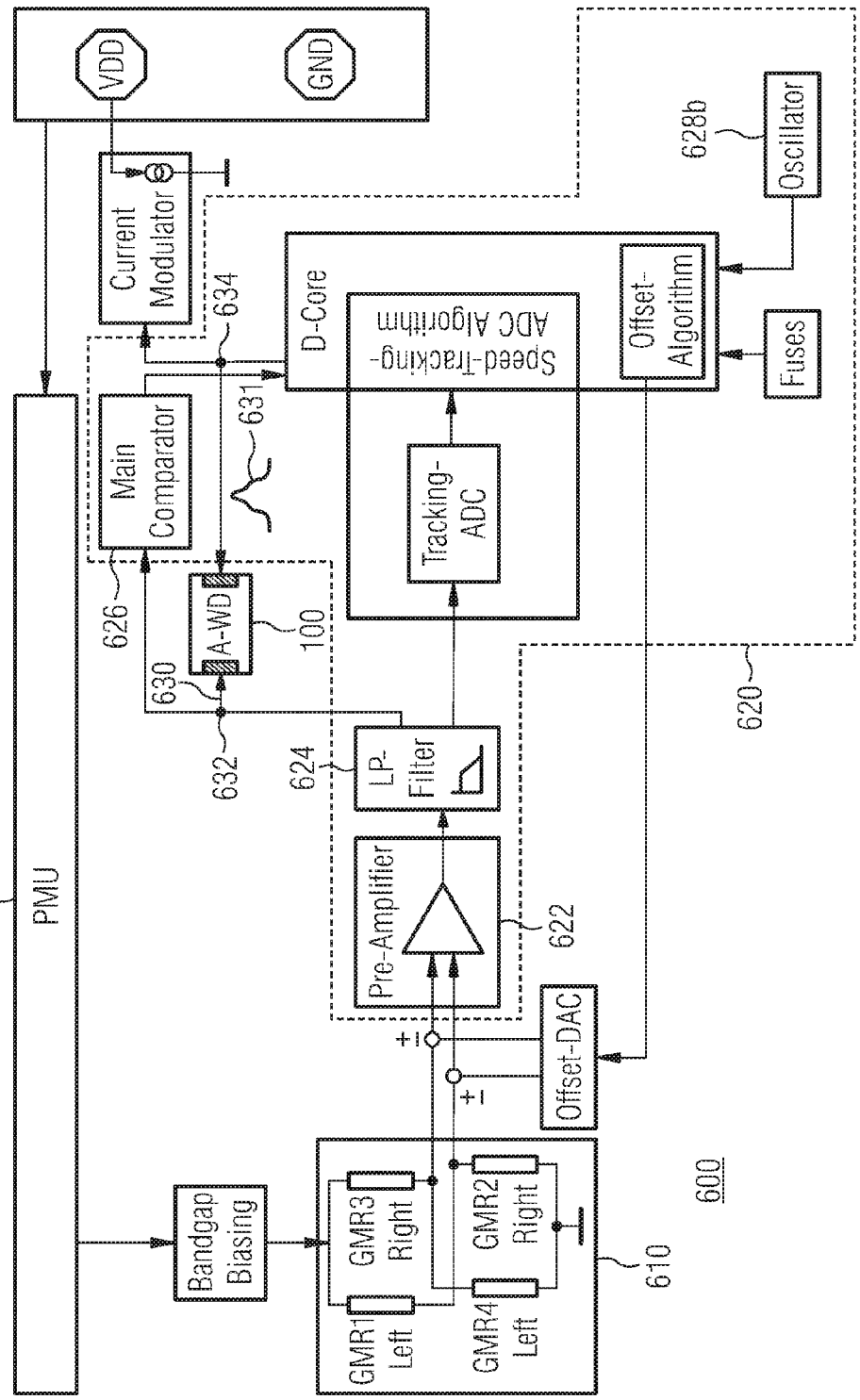
FIG. 7 illustrates a further embodiment of a speed sensor system based on the speed sensor of FIG. 6 while having a signal path with another monitored portion.
Figure 8:
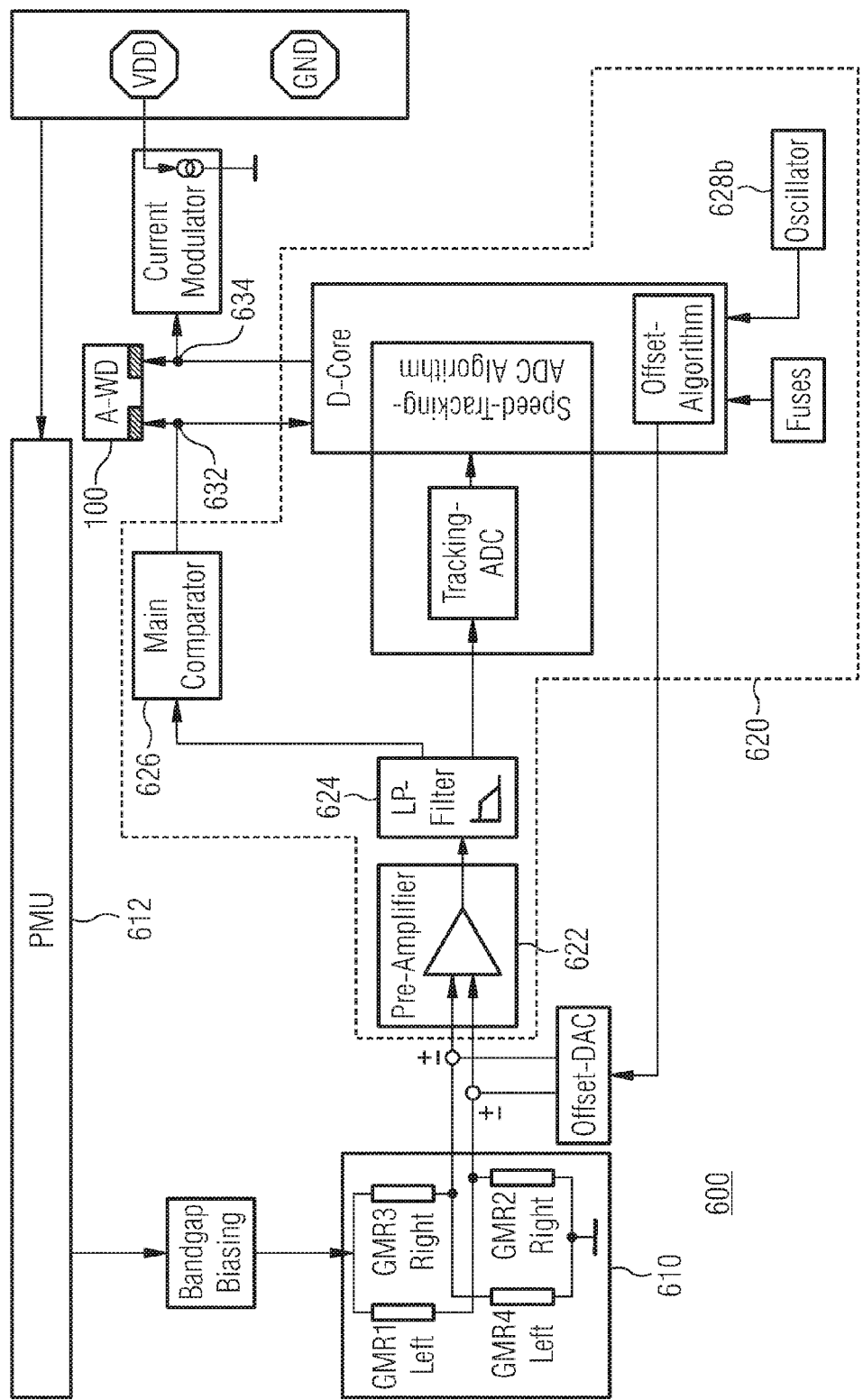
FIG. 8 illustrates a further embodiment of a speed sensor system based on the speed sensor of FIG. 7 while having a signal path with another monitored portion.

FIGS. 7 and 8 differ from the embodiments of FIGS. 5 and 6 in that the first signal 630 is received from a first position 632 further downstream the signal path 620. In particular, in FIG. 7, the first signal 630 is extracted after the low-pass filter 624, and in FIG. 8, the first signal 630 is extracted after the comparator 626. As elaborated on before, arbitrary segments of signal paths may be monitored by embodiments of monitoring units 100 to determine their integrity, once the monitoring unit 100 and the evaluator of the monitoring unit are configured appropriately. FIGS. 7 and 8 are additional examples for the flexibility of the concept described herein and correspond to the example of FIG. 5 otherwise.

Figure 9:
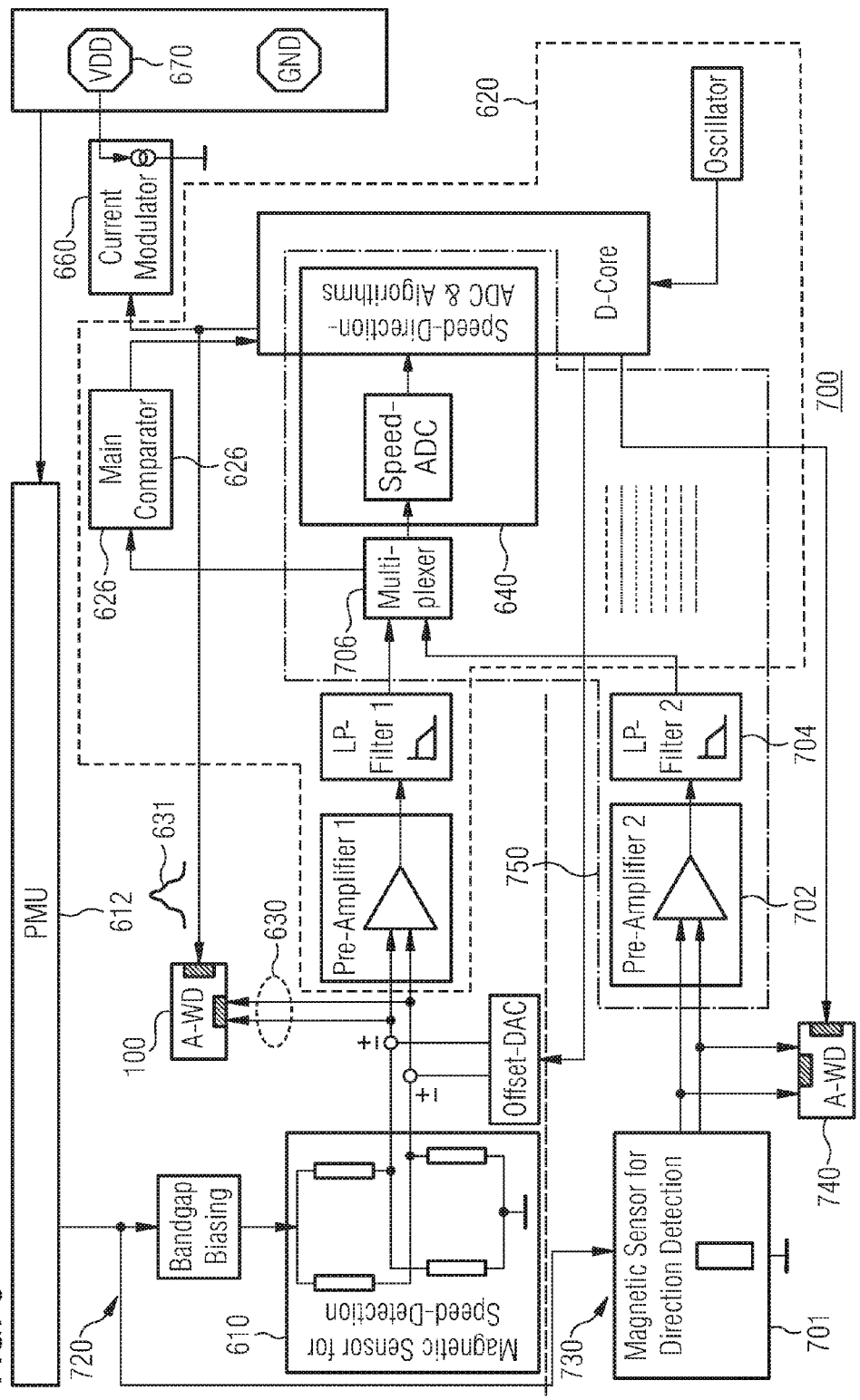
FIG. 9 illustrates an embodiment of a speed sensor system having the further capability to indicate a direction of a movement.
Figure 10:
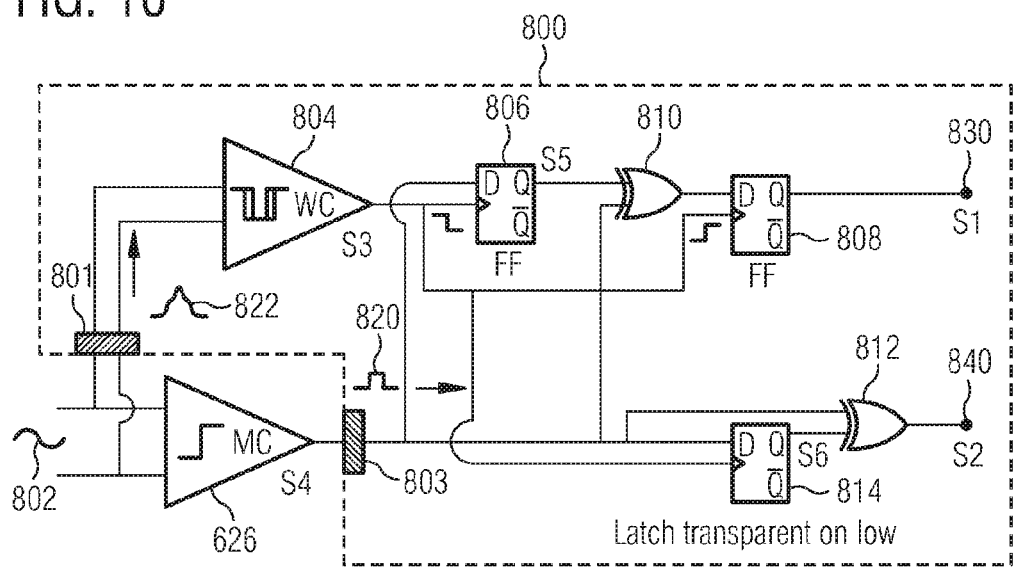
FIG. 10 illustrates an embodiment of a monitoring unit to be used within any of the embodiments of FIGS. 3 to 9.

FIG. 9 illustrates a further embodiment of a speed sensor 700 which is based on the embodiments of FIGS. 5 to 8. The embodiment of FIG. 9 further has the capability of indicating the direction of movement with respect to the speed sensor. To this end, a further sensing element 701 capable of sensing a magnetic field is present, having associated thereto a further pre-amplifier 702 as well as a subsequent further low-pass filter 704. The pre-amplified and low-pass filtered signal of the further sensing element 701 is provided to a multiplexer 706, providing the analog signal to the analog-to-digital converter 640a of the monitoring circuit 640. The analog-to-digital converter 640a of the monitoring circuit 640 further receives the signal of the sensing element 610 in order to also digitize it at time instants given by the multiplexer 706. The digital core 628a may therefore be capable of determining the direction of the movement, for example by comparing the phases of both digitized signals.

In other words, the speed sensor of FIG. 9 may also be seen as an enhanced speed sensor having a speed path 720 for determining the speed of a movement as well as a direction path 730 configured to provide an additional signal allowing to determine the direction of the movement with respect to sensor element. Corresponding to the monitoring unit 100 for the speed path 720, the direction path 730 comprises a further monitoring unit 740, which is configured to monitor a further signal path 750 associated to the further sensing element 701 as a part of the direction path 730. Since also the speed path 730 relies on the determination of the zero crossing of the further sensing element's 701 signal, alike monitoring units may be used to monitor the signal path 620 and the further signal path 750.

FIG. 10 illustrates an embodiment of a monitoring unit 800 or signal watchdog which is implemented within the analog domain in hardware. Implementing the monitoring unit 800 within the analog domain may provide for a monitoring unit 800 consuming only little semiconductor space and having inherently low failure probability. If an analog monitoring unit 800 is used to monitor a signal path 200 comprising also digital circuitry, systematic effects affecting both the monitoring unit 100 and the signal path 200 to be monitored may be avoided. Those systematic effects may, for example, be due to fluctuations in the production processes used for the monitoring unit and the signal path.

FIG. 10 illustrates, without limitation, as to how the functionality of the main comparator 626 of one of the embodiments of FIGS. 5 to 8 may be monitored by means of a monitoring unit 800 being implemented with analog circuitry. To this end, the monitoring unit 800 illustrated in FIG. 10 may, for example, be used within the speed sensor 600 of FIG. 7, where the first signal 630 is extracted at the first point 632 directly before the comparator 626 and where the second signal 631 is extracted at the second point 634 directly after the comparator 626. However, the monitoring unit 800 of FIG. 10 may also be used within any of the embodiments of FIG. 5 to 9 with no or only minor modifications apparent to the man skilled in the art making use of the present disclosure. This is due to the fact that the signal processing performed by the amplifier 622 and the low path filter 624 additionally present within the signal path 620 is such that the second characteristic corresponds to the first characteristic according to the same predefined relation, irrespective of whether the first point 632 from where the first signal 630 is extracted from is before the amplifier 622 like in the embodiment of FIG. 5, before the low pass filter 624 like in the embodiment of FIG. 6 or before the comparator 626 as in the embodiment of FIG. 7.

For example, if the monitoring unit 800 of FIG. 10 was to be used in the embodiment of FIG. 5 where the input signal 614 is extracted before being amplified by amplifier 622, it may be necessary to include a further pre-amplifier into the monitoring unit 800 itself when the input signal 614 was too weak to be reliably processed by a window comparator 804 within the monitoring unit 800. This may require additional components and associated area within the monitoring unit itself. However, at the same time, the diagnostic coverage may be increased, i.e. the monitored portion of the signal path 620 of the embodiment of FIG. 5 is greater than in the embodiment of FIG. 7, including also the amplifier 622 and the low pass filter 624 which may, according to the circumstances, be worth to spend additional area and complexity within the monitoring unit.

Figure 12:
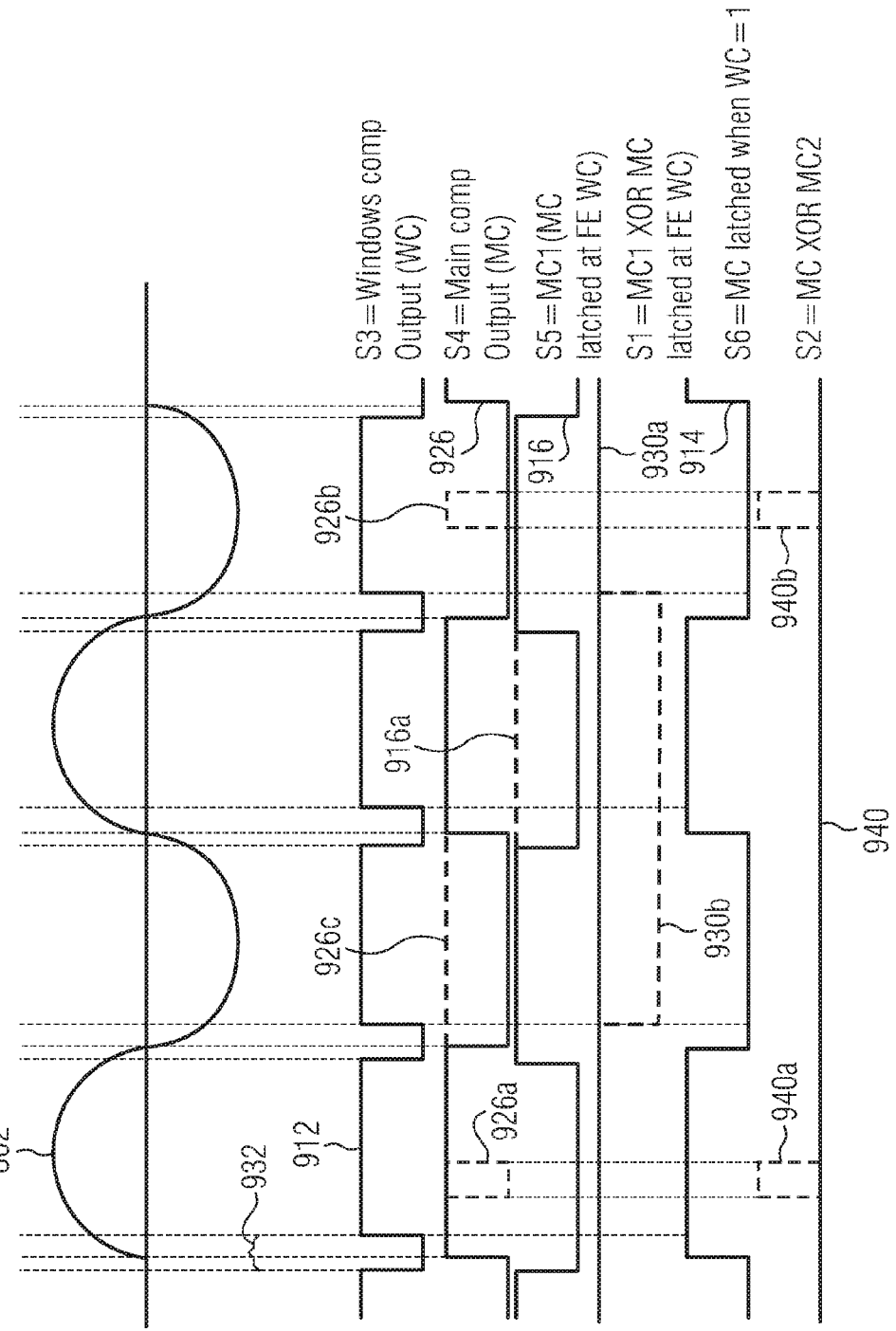
FIG. 12 illustrates a set of signals occurring within the monitoring unit of FIG. 10.

FIG. 12 shows some of the signals occurring within the monitoring unit 800 and FIG. 11 gives an example for a characteristic of a window comparator 804 known in the art which is used within the monitoring unit 800 of FIG. 10. The functionality of the monitoring unit 800 of FIG. 10 is subsequently described also referencing FIGS. 11 and 12. The first signal 822 extracted by the monitoring unit 800 is a copy of the input signal 802 to the window comparator 804. The signal monitor 801 of this particular example may therefore also be viewed as an input interface configured to couple to the input signal 802. The second signal 820 extracted by the signal interface 803 is a copy of the output of the comparator 626. For illustrative purposes, the further use of the output of the comparator 626 within the signal path 620, is not shown, since FIG. 8 focuses on the functionality of the monitoring unit 800. The signal interface 803 may therefore also be described as an input interface configured to couple to the output of the comparator 626. The first signal 822 is input to a window comparators 804. The functionality of the window comparator 804 is illustrated in FIG. 11. A man skilled in the art will be aware of the functionality of different kinds of window comparators. In short, the window comparator 804 used in the embodiment of FIG. 10 exhibits a hysteresis as already mentioned with respect to the description of FIG. 4. That is, the window comparator 804 has four thresholds 902, 904, 906 and 908. The thresholds 902 and 908 should be symmetrical with respect to zero or the vertical axis and as well as the thresholds 904 and 906. Thresholds 904 and 908 apply when the input to the window comparator 804, which is shown on the horizontal axis, approaches the thresholds from the positive side. Thresholds 906 and 902 apply when the input to the window comparator 804 approaches the thresholds from the negative side. When the input into the window comparator 804 is within the corresponding pair of thresholds 904 and 908 or 906 and 902, the output of the window comparator 804 is low, while being high else. The solid curve 910 in FIG. 11 illustrates this dependency between the input and output signals of the window comparator 804.

The monitoring unit 800 of FIG. 10 comprises a first flip-flop 806, a second flip-flop 808, a first X-OR gate 810, a second X-OR gate 812 and a latch 814 being transparent on low. The first flip-flop 806 is triggered on a negative edge of a signal at a clock input of the first flip-flop 806 while the second flip-flop 808 is triggered on a positive edge of a signal at a clock input of the second flip-flop 808. The first flip-flop 806 and the second flip-flop 808 may be D-flip-flops known in the art. If the comparator 826 is functional, i.e. if the monitored portion of the signal path works reliably and integrity is given, the comparator 626 should only switch when the differential input signal 802 crosses zero. At this time instant, the first signal 822 extracted by the monitoring unit 800 is also within a corresponding pair of thresholds of the window comparator 804 and, consequently, the output of the window comparator 804 of the monitoring unit is expected to be low at the time instant the level of the signal output by the comparator 626 changes, which is subsequently referred to as a first condition. Likewise, within the occurrence of each interval in which the window comparator 804 outputs a low signal, a change of the level of the signal output by the comparator 626 is expected, which is subsequently referred to as a second condition. When those two conditions are checked by means of the monitoring unit 800, it may be determined, whether the comparator 626, i.e. the monitored portion of the signal path, works without an error and whether, consequently, integrity of at least the monitored portion of the signal path may be assumed.

Much like in FIG. 4, FIG. 12 illustrates the input signal 802 to the comparator 626 of the signal path as well as the output signal 912 of the window comparator 804. Comparator signal 926 in solid lines illustrates the output of the comparator 626 working as expected and signals 926a, 926b and 926c illustrate signals output by the comparator 626 in the different error scenarios described in FIG. 4. Whenever the comparator 626 switches when the output signal 912 of the window comparator 804 is at the logical high level or whenever the comparator 626 does not switch when the output signal 912 is at a logical low level, the extracted second signal 820 is not consistent with the extracted first signal 822. More particularly, a second characteristic of the output signal extracted by the second signal 820 would then not correspond to a first characteristic of the input signal 802 extracted by the first signal 822 according to the predefined relation given by the two conditions defined above. The first characteristic may, for example, be defined to be the presence of the input signal 802 within an amplitude window while the second characteristic may, for example, be defined to be a change of a level of the signal output by comparator 626.

The corresponding evaluation may be performed by means of the hardware implementation of a monitoring unit 800 illustrated in FIG. 10, as summarized below. The monitoring unit 800 has two outputs 830 and 840. Output 830 is indicative of a failure according to which the signal path or the comparator 626 has failed to detect a zero crossing by means of the transition of the input signal 802 a further half wave. The second output 840 indicates when additional zero crossing or the presence of a wrong half wave is indicated by the comparator 626. FIG. 12 illustrates different possible signals at the output of the window comparator 804 (window signal 912) at the output of the comparator 626 (signals 926, 926a, 926b and 926c), at the output of the first flip-flop 806 (signals 916, 916a), at the output of the latch 814 (signal 914), at the first output 830 (signals 930a, 930b) and at the second output 840 (signal 940, 940a, 940b).

The signals are generated by means of the particular wiring of the components of the monitoring unit 800. An input of the window comparator 804 is coupled to the signal monitor 801 and an output of the window comparator 804 is coupled or connected to a clock input of the first flip-flop 806, a clock input of the second flip-flop 808 and a clock input of the latch 814. The signal interface 803 is coupled to a data input of the first flip-flop 806, to a first input of the first X-OR gate 810, to a first input of the second X-OR gate 812 and to a data input of the latch 814. A non-inverting output of the first flip-flop 806 is connected to a second input of the first X-OR gate 810. The output of the first X-OR gate 810 is connected to a data input of the second flip-flop 808. The non-inverting output of the second flip-flop 808 corresponds to the first output 830 of the monitoring unit 800. A non-inverting output of the latch 814 is coupled to a second input of the second X-OR gate 812. The output of the second X-OR gate 812 corresponds to the second output 840 of the monitoring unit 800.

When the output of the window comparator 804 becomes low, that is at the beginning of a transition time interval 932 a change of the level of the signal 926 output by the comparator 626 is expected. The first flip-flop 806 is triggered by a falling edge of the window signal 912 to copy the signal at its data input to its non-inverting output, where it is maintained until the next falling edge of the window signal 912 as illustrated by signal 916 in FIG. 12. The signal of the non-inverting output of the first flip-flop 806 is X-OR'ed with the present output of the comparator 626. Within the transition time interval 932, the window comparator 804 output remains low. However, the level of the signal 926 at the output of the comparator 626 changes within transition time interval 932 if the comparator 626 works properly. That is, during the transition time interval 932, the input signals to the first X-OR gate 810 become different, resulting in the signal output by the X-OR gate 810 becoming high within the transition time interval 932. The output of the X-OR gate 810 is provided to the first output 830 only after the end of the transition time interval 932 by triggering the second flip-flop 808 with the rising edge of the output of the window comparator 804. This results in forwarding the output of the first X-OR gate 810 to the first output 830 only after a transition between different half waves should have been occurred, resulting with a signal 930a being permanently high at the first output 830 when the comparator 626 works without error. The signal at the first output 830 can also be viewed as X-OR connection of the output of the comparator 626 during the previous half wave of the input signal 802 with the output of the comparator 626 during the present half wave. If no error occurs, both outputs are supposed to be different and, consequently, the result of the X-OR operation is high. If, however, the comparator 626 fails to determine the transition of the input signal 802 to another half wave, as illustrated by signal 926c in FIG. 12, the X-OR operation is comparing two identical signals, resulting in the signal 930b at the first output 830 being low, which is maintained until the next comparison of two different output signals of the comparator 626 can be performed, as illustrated in FIG. 12. In other words, the signal at the first output 830 is indicative, whether the second condition defined above is fulfilled or not. If the signal becomes low it can be concluded, that the comparator 626 erroneously failed to determine the transition of the input signal 802 to a further half wave, which is equivalent to a threshold crossing of zero volts.

The second output 840 indicates, whether the first condition is fulfilled or not. To this end, the latch 814 forwards the output of the comparator 626 to the second X-OR gate 812 while the output of the window comparator 804 is low, i.e. within the transition time interval 932. After the end of the transition time interval 932, the last output of the comparator 626 within the transition time interval 932 is maintained at the output of the latch 814. The second X-OR gate 812 hence compares the present output of the comparator 626 with the output of the comparator 626 at the end of the preceding transition time interval 932 defined by the window comparator 804. When the comparator 626 indicates the presence of another half wave within the transition time interval 932 as expected, the output of the second X-OR gate 812 will be low, since the latch 814 is transparent during the transition time interval 932 so that identical signals are provided to the inputs of the second X-OR gate 812. However, if the output of the comparator 626 changes after the transition time interval 932 as illustrated by means of signals 926a or 926b in FIG. 12 due to an error, different signals are provided to the inputs of the second X-OR gate 812. Consequently, the output of the second X-OR gate 812 and hence the signal at the second output 840 will become high, as illustrated by signal shapes 940a and 940b in FIG. 12. In other words, when the second output 840 of the monitoring unit 800 becomes high, the first condition relating the first characteristic and the second characteristic is not fulfilled and it can be concluded, that the comparator 626 erroneously determined the presence of a half wave.

In summary, during the normal mode of operation (given by the comparator output signal 926 in solid lines), both output signals 930 and 940 remain constant, which means at logical high level for signal 930a at the first output 830 and at constant logical low level for signal 940 at the second output 840. If the comparator 626 erroneously detects the presence of a threshold crossing, as illustrated by dashed signals 926a or 926b, the signal 940 at the second output 840 changes its state to become logically high, indicating that an additional zero crossing was erroneously indicated within the signal path.

If the comparator 626 fails to detect the presence of a threshold crossing, as illustrated by signal 926c in dashed lines, the signal 930 at the first output 830 changes from logical high to logical low. By separately evaluating the two error conditions defined previously, the monitoring unit 800 is not only capable of positively indicating whether the monitored portion of the signal path is working without an error, but to also identifying the type of error and so the inconsistent information within the second signal 820. In doing so, the error within the output of the comparator 626 may even be corrected. The signals at the first output 830 and at the second output 840 may also be combined to arrive at a single failure indication signal representing both error types, like failure indication signal 530 of FIG. 4. To arrive at the failure indication signal illustrated in FIG. 4, the signal at the first output 830 may, for example, be inversed and X-OR'ed with the signal at the second output 840.

Figure 13:
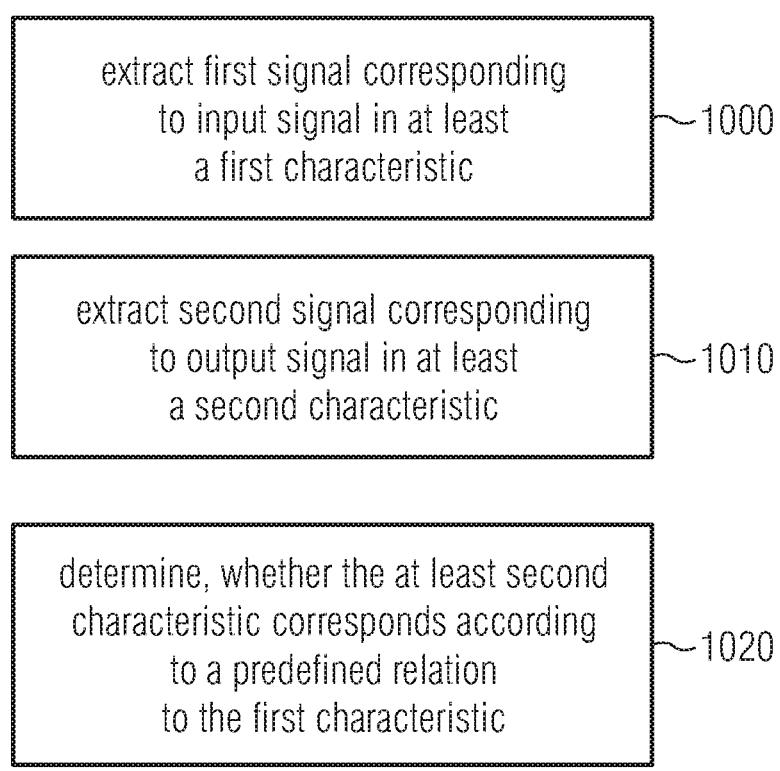
FIG. 13 illustrates a flowchart of an embodiment of a method for monitoring an integrity of a signal path.

FIG. 13 illustrates a flowchart of a method for monitoring an integrity of a signal path configured to receive an input signal and to provide an output in response to the input signal. The method comprises extracting a first signal 1000 from the signal path, the first signal corresponding to at least first characteristic of the input signal. The method further comprises extracting a second signal 1010 corresponding to the output signal in at least a second characteristic from the signal path. The method further comprises determining 1020, whether the at least second characteristic corresponds according to a predefined relation to the first characteristic. The embodiments illustrated in FIGS. 2 to 10 relate to hardware implementations of signal paths and monitoring units. However, further embodiments may also relate to software implementations where the individual processing steps within the signal path are implemented in software so that the signal path may be seen as a series of subsequently processed computational steps. A particular example may be a software implementation of a digital filter where the individual computations required to implement the digital filter constitute the signal path. Extracting the first signal may be achieved by deriving the first characteristic from an intermediate result after one of the individual computational steps and the second signal may be extracted by deriving the second characteristic from a further intermediate result after one of the subsequent computational steps. Also, the determining whether the at least second characteristic corresponds according to a pre-defined relation to the first characteristic, can be implemented purely in software.

Embodiments of monitoring units or signal processing systems or sensors as described herein allow to determine inconsistent operational stages of signal paths or sensor systems at a low hierarchical level. For example, in the event of a system comprising a multitude of wheel speed sensors, a plausibility or consistency check between the signals provided of the individual wheel speed sensors has up to now been performed at an upper hierarchy level of the whole system, for example within an electronic control unit. This generates a lot of signal overhead and does not under all circumstances allow to conclude on the presence of an error or even on the type of an error. For example, if two wheel speed sensors provide standstill information while the other two speed sensors transfer speed information, it is not reliably possible to conclude which of the sensors provides unreliable information. Further, such possibility checks increase the complexity of the ECU program. For example, normal operation mode has to be interrupted periodically for safety and consistency checks to ensure the correct functionality of the components. Diagnostic test intervals and periodical interruption may be reduced when sensors according to the embodiments described herein are used.

Sensors or signal paths for monitoring units may actively communicate a processing failure or an inconsistency or missing integrity (a failure indication state). Such an indication may be interpreted by the ECU of further circuitry. In particular, an already existent protocol may be reused in that, for example, a third current level is introduced within a protocol relying on different current levels to communicate information between the sensors and the ECU of further devices. This allows, for example, to provide sensor elements or signal processing chains which are compliant to the ISO 26262 standard, requiring the capability of self-diagnosis and the possibility of switching individual devices into a safe mode of operation. The embodiments described herein may be integrated easily and without a significant increase of costs, as compared to, for example, to fully redundant implementations. In the event of a wheel speed sensor, a conversion of the analog sensor element output signal (or a branch connection within the functional where a digital representation of the analog signal is available) is required. A comparator circuit (analog or digital) may compare these digital pulses with digital signal pulses or shapes at the output interface of the sensor, allowing to conclude on the integrity of the signal path. While the additionally required area on a monolithically integrated circuit may be low, the monitoring unit or signal watchdog may monitor the whole signal path within the sensor to detect possible opens and shorts within the signal path. To this end, the embodiments as described herein may be provided with a high diagnostic coverage, reducing the total residual risk and resulting in a low residual failure rate of the sensor element or product.

An embodiment is a sensor system for determining information on a movement of an object, comprising at least one signal processing system comprising a signal path configured to receive an input signal and to provide information on the movement of the object as an output of the signal path in response to the input signal; and a monitoring unit for monitoring an integrity of a signal path, comprising: a signal monitor configured to extract a first signal from the signal path corresponding to the input signal in at least a first characteristic; a signal interface coupled to the signal path further downstream than the signal monitor, the signal interface configured to extract a second signal corresponding to the output in at least a second characteristic from the signal path; and an evaluator configured to determine, whether the at least second characteristic corresponds according to a predefined relation to the first characteristic. The sensor system further comprises an output interface configured to provide the information on the movement of the object.

According to a further embodiment, the information on the movement of the object comprises an information on a relative speed between the sensor element and at least a part of the object or on a direction of the movement of the at least a part of the object with respect to the sensor element.

According to a further embodiment, the information on the movement of the object comprises an information on a rotational velocity or on a direction of a rotation of a wheel.

According to a further embodiment, the output interface is configured to use one or more distinct current levels to provide the information on the movement of the object and a further current level to provide a failure signal; wherein the one or more current levels are distinct from the further current level, respectively.

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The invention claimed is:

1. A monitoring unit for monitoring an integrity of a signal path configured to receive an input signal and further configured to provide an output in response to the input signal, the monitoring unit comprising:
   at least one sensor element coupled to the signal path to provide the input signal, and configured to provide a sensor signal indicative of a physical quantity as the input signal;
   a signal monitor configured to extract a first signal from the signal path corresponding to the input signal in at least a first characteristic;
   a signal interface configured to extract a second signal corresponding to the output in at least a second characteristic from the signal path; and
   an evaluator configured to determine, whether the at least second characteristic corresponds according to a predefined relation to the first characteristic.

2. The monitoring unit of claim 1, wherein the first signal is an analog signal and the second signal is a digital signal or wherein the second signal is an analog signal and the first signal is a digital signal.

3. The monitoring unit of claim 1, wherein the first signal and the second signal are analog signals or wherein the first signal and the second signal are digital signals.

4. The monitoring unit of claim 1, wherein the monitoring unit is implemented within an analog domain or within a digital domain.

5. The monitoring unit of claim 1, wherein the first characteristic is at least one of a zero crossing, a passing of a threshold, a polarity, a frequency or a value of a signal at a given time.

6. The monitoring unit of claim 1, wherein the monitoring unit is further configured to provide an indication if the second characteristic is not corresponding to the at least first characteristic according to the predefined relationship.

7. The circuit of claim 6, wherein the monitoring unit is configured to identify an inconsistent information within the second signal.

8. A signal processing system, comprising:
   a signal path configured to receive an input signal and to provide an output in response to the input signal;
   at least one sensor element coupled to the signal path to provide the input signal, and configured to provide a sensor signal indicative of a physical quantity as the input signal; and
   a monitoring unit for monitoring an integrity of the signal path, comprising:

a signal monitor configured to extract a first signal from the signal path corresponding to the input signal in at least a first characteristic;

a signal interface coupled to the signal path further downstream than the signal monitor, the signal interface configured to extract a second signal corresponding to the output in at least a second characteristic from the signal path; and an evaluator configured to determine, whether the at least second characteristic corresponds according to a predefined relation to the first characteristic.

9. The signal processing system of claim 8, wherein the signal path and the monitoring unit are monolithically integrated.

10. The signal processing system of claim 8, wherein the at least one sensor element is configured to sense a magnetic field.

11. The signal processing system of claim 10, wherein the at least one sensor element comprises at least one magneto resistive sensing element and/or Hall sensing element.

12. The signal processing system of claim 8, wherein the at least one sensor element is a speed sensor.

13. The signal processing system of claim 8, wherein the signal path comprises at least one of an amplifier, a comparator, a filter, an analog-to-digital converter and a digital circuit.

14. The signal processing system of claim 13, wherein the signal path comprises a digital circuit, the digital circuit comprising a digital core and an oscillator configured to generate a clock signal for the digital core.

15. The signal processing system of claim 14, wherein the signal interface of the monitoring unit is coupled to the signal path downstream the input of the digital circuit.

16. The signal processing system of claim 13, wherein the signal monitor of the monitoring unit is coupled to the signal path upstream the amplifier, upstream the filter, upstream the comparator, upstream the analog-to-digital converter and/or upstream the digital circuit.

17. A method for monitoring an integrity of a signal path configured to receive an input signal and to provide an output in response to the input signal, the method comprising:

providing, by at least one sensor element coupled to the signal path, a sensor signal indicative of a physical quantity as the input signal;

extracting a first signal from the signal path corresponding to at least a first characteristic of the input signal;

extracting a second signal corresponding to the output in at least a second characteristic from the signal path; and determining, whether the at least second characteristic corresponds according to a predefined relation to the first characteristic.

\* \* \* \* \*